(12) United States Patent
Kakimoto et al.

(10) Patent No.: US 6,181,278 B1
(45) Date of Patent: Jan. 30, 2001

(54) ANTENNA-INTEGRAL HIGH FREQUENCY CIRCUIT ELECTROMAGNETICALLY COUPLING FEEDER CIRCUIT CONNECTED TO HIGH FREQUENCY CIRCUIT TO MICROSTRIP ANTENNA VIA SLOT COUPLING HOLE

(75) Inventors: Noriko Kakimoto; Eiji Suematsu, both of Nara (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/044,867

(22) Filed: Mar. 20, 1998

(30) Foreign Application Priority Data

Mar. 21, 1997 (JP) .................................................... 9-068477

(51) Int. Cl.[7] ........................... H01Q 23/00; H01Q 13/08
(52) U.S. Cl. .................................. 343/700 MS; 343/853; 333/247
(58) Field of Search .................... 333/247; 343/700 MS, 343/853; H01Q 23/00

(56) References Cited

U.S. PATENT DOCUMENTS

| | | | |
|---|---|---|---|
| 5,400,039 | * | 3/1995 | Araki et al. ................... 343/700 MS |
| 5,404,581 | * | 4/1995 | Honjo ........................ 343/700 MS X |
| 5,903,239 | * | 5/1999 | Takahashi et al. ............ 343/700 MS |

FOREIGN PATENT DOCUMENTS

| | | | |
|---|---|---|---|
| 6045824 | * | 2/1994 | (JP) ............................... H01Q 23/00 |
| 6077729 | * | 3/1994 | (JP) ............................... H01Q 23/00 |

\* cited by examiner

*Primary Examiner*—Benny T. Lee
(74) *Attorney, Agent, or Firm*—Birch, Stewart, Kolasch & Birch

(57) ABSTRACT

An antenna-integral high frequency circuit includes: a first grounding conductor surrounding a microstrip antenna; a first via hole connecting the first grounding conductor and a second grounding conductor; and a second via hole connecting the second grounding conductor and a third grounding conductor such that the distance from the second grounding conductor to a fourth grounding conductor is less than a predetermined value.

16 Claims, 13 Drawing Sheets

ANTENNA-INTEGRAL HIGH FREQUENCY CIRCUIT ELECTROMAGNETICALLY COUPLING FEEDER CIRCUIT CONNECTED TO HIGH FREQUENCY CIRCUIT TO MICROSTRIP ANTENNA VIA SLOT COUPLING HOLE

BACKGROUND OF THE INVENTION

1. Field of the Invention

The present invention relates to an antenna-integral high frequency circuit which is miniaturized, has light weight and is superior easy to produce, and more specifically to an antenna-integral high frequency circuit having a superior high frequency characteristic.

2. Description of the Background Art

Recently, rapid and large-capacity personal communication using a high frequency wave, such as microwave and millimeter wave, has attracted attention with the recent improvement in the processing speed of information processors and in the resolution of image processing apparatuses. In such devices, a miniaturized, light-weight and high-performance microwave and millimeter wave transmitter/receiver can be implemented by not only simply integrating a microwave and millimeter wave circuit with an antenna but by also configuring the integrated structure to make use of the high frequency characteristics of utilized microwave and millimeter wave. Japanese Patent Laying-Open No. 8-56113 discloses an invention as one of such antenna-integral microwave and millimeter wave circuits.

FIG. 1 shows a structure of an antenna-integral microwave and millimeter wave circuit disclosed in Japanese Patent Laying-Open No. 8-56113. The antenna-integral microwave and millimeter wave circuit includes a grounding conductor film 102, a dielectric film 103 formed of silicon dioxide film, a plane antenna 104, a semiconductor substrate 105 with a detector circuit, a microstrip line 107 for feeding power to plane antenna 104, an output signal terminal 108 for outputting detected signals, a dielectric substrate 113, and a slot 116. Plane antenna 104 is formed on one surface of dielectric substrate 113. Grounding conductor film 102 including slot 116 is formed on the other surface of dielectric substrate 113, and dielectric film 103 is deposited thereon with grounding conductor film 102. Microstrip line 107 and output signal terminal 108 are formed on the other surface of dielectric film 103 and are connected to semiconductor substrate 105 including the detector circuit.

Microstrip line 107 and plane antenna 104 are coupled via slot 116 using an electromagnetic field and thus form an antenna-integral microwave circuit.

However, the invention disclosed in Japanese Patent Laying-Open No. 8-56113 has the following disadvantages.

(1) an antenna grounding conductor is not present near the antenna. Accordingly, the potential of plane antenna 104 is unstable, resulting in disturbance of the radiation pattern caused by a conductor, such as metal, located near the plane antenna, degradation in radiation efficiency, a cause of noise generation and the like.

(2) Even if grounding conductor film 102 serves as the plane antenna's 104 grounding conductor, a conductor grounding the microwave and millimeter wave circuit is still not connected to the antenna grounding conductor in the vicinity of the microwave and millimeter wave circuit. Accordingly, the antenna grounding conductor can not be a true ground with respect to the microwave and millimeter wave circuit 105 grounding conductor, the reason of which will be described later. Accordingly, the detector circuit formed at semiconductor substrate 105 is unable to achieve less noisy, stable operation, resulting in unstable operation, such as parasitic oscillation, and increased parasitic capacitance. At the plane antenna 104 side, electromotive force will occur in the conductor grounding the detector circuit formed at semiconductor substrate and in the plane antenna 104 grounding conductor and thus causes an unnecessary radiation pattern with high side lobe. Furthermore, variation of the input impedance of plane antenna 104 also occurs, resulting in a cause of degradation of the radiation efficiency of plane antenna 104 and a cause of variation of the resonance frequency of plane antenna 104.

(3) Among dielectric film 103 and dielectric substrate 113, dielectric film 103, connected to semiconductor substrate 105, is in the form of a thin film. Accordingly, for the frequency regions of microwave and millimeter wave, the conductor for microstrip line 107 must have a reduced width, which will in turn cause a large transmission loss. The strength of the entirety of the antenna-integral microwave and millimeter wave circuit depends almost only on dielectric substrate 113. However, the thickness of dielectric substrate 113 must be reduced to obtain the desired characteristic impedance (typically 50Ω) for the frequencies of microwaves and millimeter waves. Accordingly, it is difficult to handle, and a high production yield cannot be expected. Particularly, such a flip-chip connection of semiconductor substrate 105 as shown in FIG. 1 is typically made in high temperature environments and with a high current load, and a thin dielectric substrate 113 is thus not practical. The examples of dielectric film 103 include silicon dioxide, silicon nitride or polyimide. However, silicon dioxide and silicon nitride, which are resistant to heat, have low impact resistances and cracks are readily caused therein in flip-chip bonding. Polyimide is inferior in heat resistance and is thus difficult to use for flip-chip connection by thermocompression bonding, and such a technique must be employed by placing resin between semiconductor substrate 105 and dielectric film 103 to connect them through adhesion. Accordingly, the insufficient bonding in a conductor transmitting signals between semiconductor substrate 105 and output signal terminal 108 or microstrip line 107, which is not particularly disadvantageous for direct current or low frequency, readily causes reflection in high frequency. The use of resin also increases the apparent dielectric constant of dielectric film 103 and thus results in more stringent limitations on circuit design. Furthermore, resin can inherently be significantly disadvantageous in reliability. Polyimide is relatively soft and plastically deformed and is thus difficult to repair.

(4) The deposition of only a single layer (the plane antenna 104 layer) on one surface and three layers (the grounding conductor film 102, dielectric film 103 and microstrip line 107 layers) on the other surface of dielectric substrate 113 requires a increased number of manufacturing steps. After each step, the difference in internal stress is increased between the layer on one surface and a layer on the other surface, causing disadvantages such as bowing. It is thus difficult to obtain a good high frequency characteristic.

(5) Since not only semiconductor substrate 105 but dielectric substrate 113 (including grounding conductor film 102, dielectric film 103, microstrip line 107, output signal terminal 108, dielectric substrate 113, plane antenna 104 and slot 116) mounted with semiconductor substrate 105 are manufactured by a semiconductor process, caputalization and running costs are higher and the mass productivity is lower than those of e.g., thick-film print processes. Although a semiconductor process is superior in the precision in radiation pattern, thick-film print process also achieves a practically sufficient level of precision in radiation pattern. While the precision in flip-chip mounting rather depends on the precision of the flip-chip bonder, the recent bonding equipment has achieved the required precision level.

SUMMARY OF THE INVENTION

One object of the present invention is to provide an antenna-integral high frequency circuit with a stably operating high frequency circuit.

The antenna-integral high frequency circuit in one aspect of the present invention includes a first conductor layer with a microstrip antenna formed therein, a second conductor layer including a first grounding portion with a first slot coupling hole formed therein, a third conductor layer including a feeder circuit electromagnetically coupled with the microstrip antenna via the first slot coupling hole and also including a second grounding portion, a fourth conductor layer including an input/output terminal portion connected to the feeder circuit and also including a third grounding portion connected to the second grounding portion, a semiconductor device including a high frequency circuit having the fourth conductor layers formed on a surface thereof, a first dielectric substrate deposited between the first and second conductor layers, a second dielectric substrate deposited between the second and third conductor layers, and a first connecting portion provided to connect the first and second grounding portions such that the distance from the first grounding portion to the third grounding portion is less than a predetermined value.

Since the first connecting portion connects the first and second grounding portions such that the distance from the first to third grounding portions is less than a predetermined value, the ground of the high frequency circuit is stabilized and the high frequency circuit can operate stably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
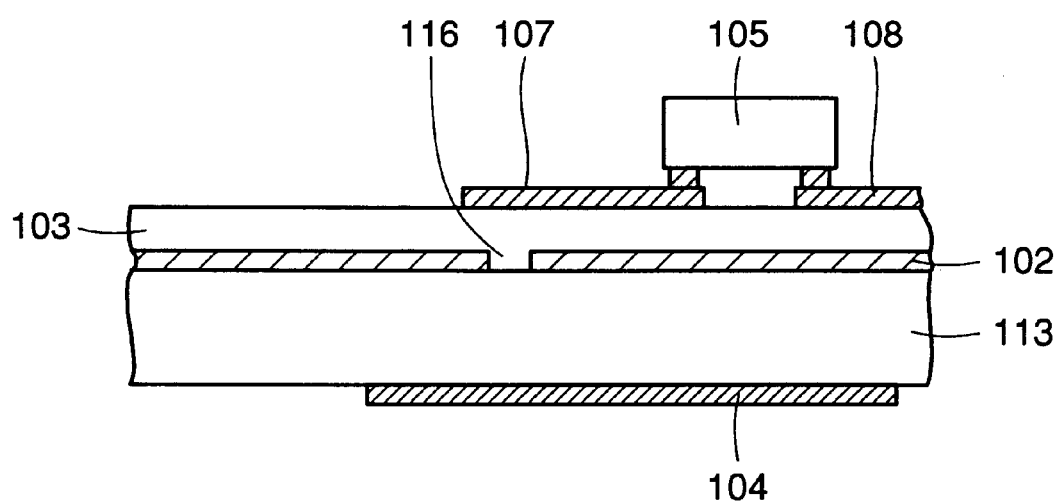
FIG. 1 shows a structure of a conventional antenna-integral microwave and millimeter wave circuit.
Figure 2:
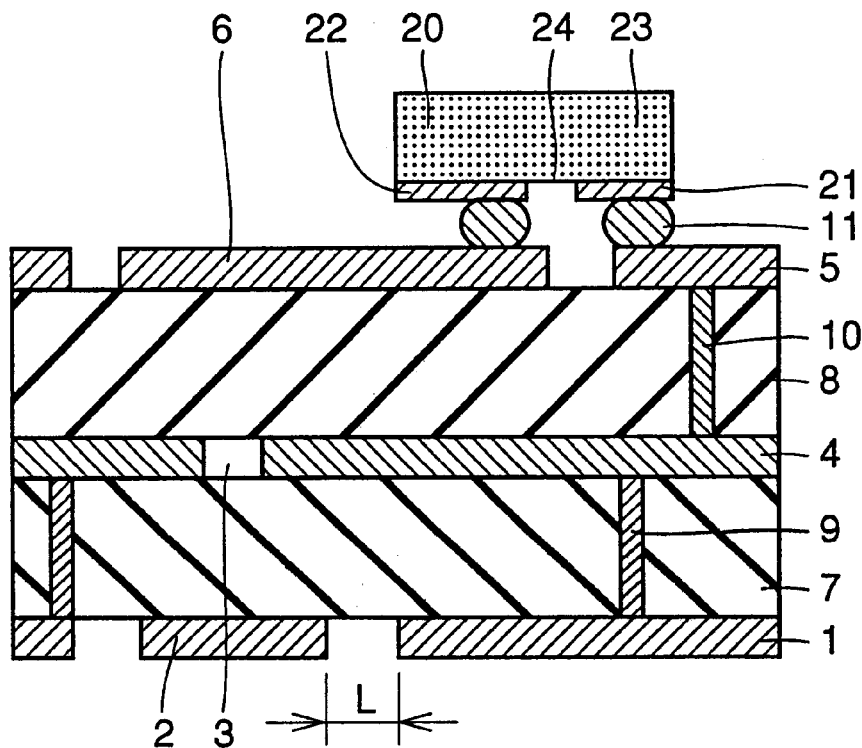
FIG. 2 is a cross section of an antenna-integral microwave and millimeter wave circuit according to a first embodiment of the present invention.

Referring to FIG. 2, an antenna-integral microwave and millimeter wave circuit includes a first conductor layer including a first grounding conductor 1 and a microstrip antenna 2, a second conductor layer including a second grounding conductor 4 with a first slot coupling hole 3 formed therein, a third conductor layer including a third grounding conductor 5 and a feeder circuit 6, a first dielectric substrate 7 deposited between the first and second conductor layers, a second dielectric substrate 8 deposited between the second and third conductor layers, a first via hole 9 (a connecting portion) for connecting the first and second grounding conductors 1 and 4, a second via hole 10 (a connecting portion) for connecting the second and third grounding conductors 4 and 5, a semiconductor device 20 including a fourth grounding conductor 21, an input/output terminal portion 22, a semiconductor substrate 23 and a microwave and millimeter wave circuit 24, and a connecting member 11.

Feeder circuit 6 and the third grounding conductor 5 are provided on one surface of the second dielectric substrate 8. Formed on the opposite surface of the second dielectric substrate 8 is the second grounding conductor 4 with the first slot coupling hole 3 located approximately just under feeder circuit 6. The third grounding conductor 5 is connected to the second grounding conductor 4 via the second via hole 10. The second dielectric substrate 8 is made of a ceramic, with a dielectric constant of approximately ten, on one surface of which feeder circuit 6 and the third grounding conductor 5 formed of a same material are simultaneously printed in a form of thick film. Printed on the opposite surface of the second dielectric substrate 8 is the second grounding conductor 4 in a form of thick film provided with the first slot coupling hole 3. The second via hole 10 is formed by punching the second dielectric substrate 8 to form a hole and filling the hole with a conductor. The conductor may be formed by plating. Since the second dielectric substrate 8 has a relatively large dielectric constant, the size of feeder circuit 6 can be reduced and the degree of freedom of design can be significantly increased. Feeder circuit 6 is located approximately just over the first slot coupling hole 3 and a microwave or millimeter wave signal can be more efficiently coupled between feeder circuit 6 and the first slot coupling hole 3 through the effect of electromagnetic field. The electrical connection of the second and third grounding conductors 4 and 5 via the second via hole 10 in the shortest distance can enhance and stabilize ground.

Microstrip antenna 2 and the first grounding conductor 1 surrounding microstrip antenna 2 are provided on one surface of the first dielectric substrate 7. Provided on the opposite surface of the fist dielectric substrate 7 is the aforementioned second grounding conductor 4. The first grounding conductor 1 is connected to the second grounding conductor 4 via the first via hole 9. The first dielectric substrate 7 is made of a ceramic, with a dielectric constant of approximately five, on the bottom surface of which microstrip antenna 2 and the first grounding conductor 1 formed of a same material are simultaneously printed in a form of thick film. The first via hole 9 is formed by drilling the first dielectric substrate 7 to form a hole and filling the hole with a conductor. The conductor may be formed by plating. The dielectric constant of the first dielectric substrate 7 is approximately five and thus relatively smaller than that of dielectric substrate 8 and microstrip antenna 2 can thus obtain an effective, good radiation characteristic. Since microstrip antenna 2 is surrounded by the first grounding conductor 1, it is not affected by a neighboring conductor, such as a metal screw and a presser plate spring for fixing the antenna-integral microwave and millimeter wave circuit, and can thus obtain a good radiation pattern with reduced side lobe.

The first slot coupling hole 3 is positioned approximately just over microstrip antenna 2 and an effective coupling can be provided between the first slot coupling hole 3 and microstrip antenna 2 through the effect of electromagnetic field. Particularly for millimeter wave, such a coupling provides smaller coupling loss than coupling with the microstrip antenna by means of electrical connection, such as through hole, and can also achieve a good characteristic with reduced interference. Since the first and second grounding conductors 1 and 4 are electrically connected by the first via hole 9 in the shortest distance, they can have the same potential as ground and achieve a less noisy, stable operation. Desirably, a distance L between microstrip antenna 2 and the first grounding conductor 1 is approximately one tenth of an effective wavelength of microwave or millimeter wave to approximately ten times larger than the effective wavelength of microwave or millimeter wave.

Semiconductor device 20, mounted on the third conductor layer, has microwave and millimeter wave circuit 24 formed on semiconductor substrate 23, input/output terminal portion 22 of microwave and millimeter wave circuit 24 connected to feeder circuit 6, and the fourth grounding conductor 21 of microwave and millimeter wave circuit 24 connected to the third grounding conductor 5. It should be noted that in the present embodiment, a GaAs substrate suitable for high frequency application is employed as semiconductor substrate 24 and photolithography is employed for forming the microwave and millimeter wave circuit 24. Microwave and millimeter wave circuit 24 is formed of such elements as an amplifier, a filter, a frequency mixer (an up converter, a down converter) and an oscillator. Microwave and millimeter wave circuit 24 may mainly be formed of a coplanar line or microstrip line. Semiconductor device 20 and the third conductor layer are connected via connecting member 11 by flip-chip bonding with semiconductor device 20 facing downward. Input/output terminal portion 22 of microwave and millimeter wave circuit 24 and the fourth grounding conductor 21 are connected to feeder circuit 6 and the third grounding conductor 5, respectively, via connecting member 11 with a sufficiently reduced length. Accordingly, there is almost no effect of high frequency characteristic due to the parasitic inductance or parasitic capacitance caused by connecting member 11 and the fourth and third grounding conductors 21 and 5 attain the same ground potential and microwave and millimeter wave circuit 24 can thus operate stably. In particular, the electrical connection on the grounding conductors 1, 4, 5 and 21 using via holes 9 and 10 and connecting member 11 in a sufficiently reduced distance, allows microwave and millimeter wave circuit 24 to obtain a less noisy, stable operation characteristic.

Figure 3:
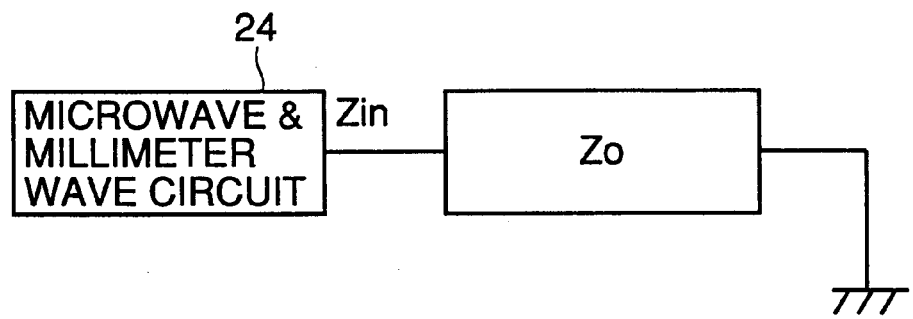
FIG. 3 shows a model for calculating an impedance of a transmission line in microwave and millimeter wave bands.

In order to achieve stable operation of the microwave and millimeter wave circuit, the ground potential of the microwave and millimeter wave circuit need be 0 V for all operating frequencies of microwave and millimeter wave. Referring to FIG. 3, when an end of a transmission line is short-circuited, an impedance $Z_{in}$ at the microwave and millimeter wave circuit 24 is represented by the following expression:

$$Z_{in}=j \cdot Z_0 \cdot \tan \beta L \ (\beta=2\pi/\lambda_g) \quad (1)$$

wherein $Z_0$ represents a characteristic impedance of the transmission line, $\lambda_g$ an effective wavelength of microwave or millimeter wave, and l a length of the transmission line.

For the antenna-integral microwave and millimeter wave circuit shown in FIG. 2, the length l of the transmission line is the distance from the fourth grounding conductor 21 of microwave and millimeter wave circuit 24 through connecting member 11, the third grounding conductor 5 and via hole 10 to the second grounding conductor 4. Assuming characteristic impedance $Z_0$ as a constant, when $l=\lambda_g/4$, equation (1) gives $\infty\Omega$, i.e., represents the same condition that microwave and millimeter wave circuit 24 is not grounded and microwave and millimeter wave circuit 24 will not operate. Thus, stable operation of microwave and millimeter wave circuit 24 requires a distance l from the fourth grounding conductor 21 to the second grounding conductor 4 that is sufficiently smaller than $\lambda_g/4$.

The first and second dielectric substrates 7 and 8 of the antenna-integral microwave and millimeter wave circuit according to the present embodiment are 150 μm and 250 μm in thickness, respectively. An approximate expression of an operating limit fgs of an ideal operating frequency of a microstrip line formed on the first dielectric substrate 7 or the second dielectric substrate 8 is given as follows:

$$fgs = 21.3 / \left((W + 2h)\sqrt{(\varepsilon_r + 1)}\right) \quad (2)$$

wherein W represents a width (mm) of the microstrip line, h a thickness (mm) of the dielectric substrate, and $\varepsilon_r$ a relative dielectric constant of the dielectric substrate.

As can be understood from equation (2), the value of operating limit fgs of the ideal operating frequency of the microstrip line is increased as the relative dielectric constant of the dielectric substrate, the width W of the microstrip line or the thickness of the dielectric substrate is reduced. However, the width W of the microstrip line is typically no less than 50 $\mu$m, since it is difficult to provide a width W of no more than 50 $\mu$m of the microstrip line according to the interconnection rules for dielectric substrates. Furthermore, it is often difficult to manufacture a dielectric substrate in the form of a single ceramic layer with a thickness h as the current limit of dielectric substrate manufacturing technique, i.e. approximately 50 $\mu$m, since a single ceramic layer is disadvantageous in transverse rupture strength and is disadvantageously deformed. Accordingly, a thickness h of at least 150 $\mu$m is desirable, considering the strength of the dielectric substrate required in handling it in the manufacturing process. For these reasons, the thickness of each dielectric substrate is provided as described above.

Figure 4:
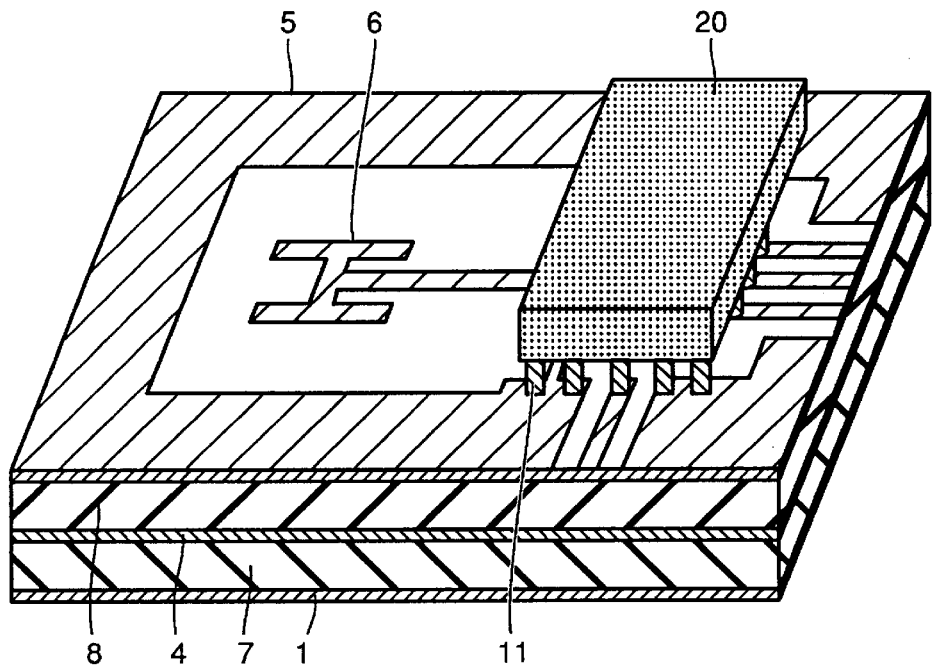
FIG. 4 is a perspective view of the antenna-integral microwave and millimeter wave circuit according to the first embodiment.

Referring to FIG. 4, semiconductor device 20 faces downward and is connected via connecting member 11 by flip-chip bonding. The grounding conductor 1 is at the bottom, on top of which is the first dielectric substrate 7, the second grounding conductor 4, the second dielectric substrate 8, and the third conducting layer including a grounding conductor 5 and a feeder circuit 6.

Figure 5:
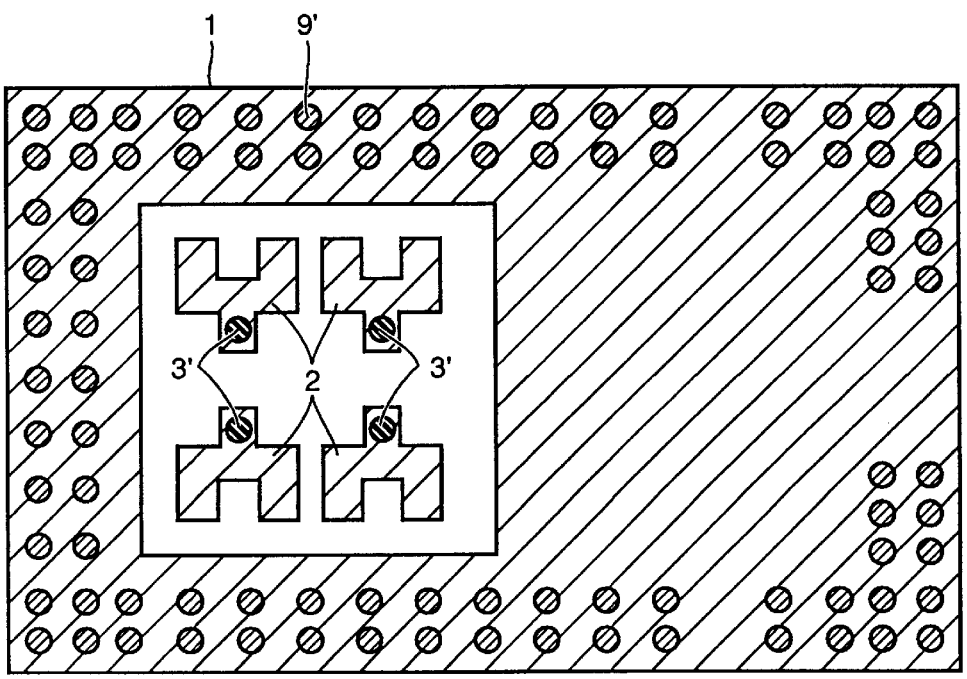
FIGS. 5 and 6 show first and second conductor layers of the antenna-integral microwave and millimeter wave circuit according to the first embodiment, respectively.

Referring to FIG. 5, the first slot coupling hole 3 (see FIG. 2) provided in the second conductor layer is formed to be positioned at a position 3' of microstrip antenna 2 when it is seen from the first conductor layer. The first via hole 9 (see FIG. 2) provided between the first and second grounding conductors 1 and 4 is formed in the first grounding conductor 1 at a position 9'. The circles indicated on grounding conductor 1 represent the positions of the first via holes 9.

Figure 6:
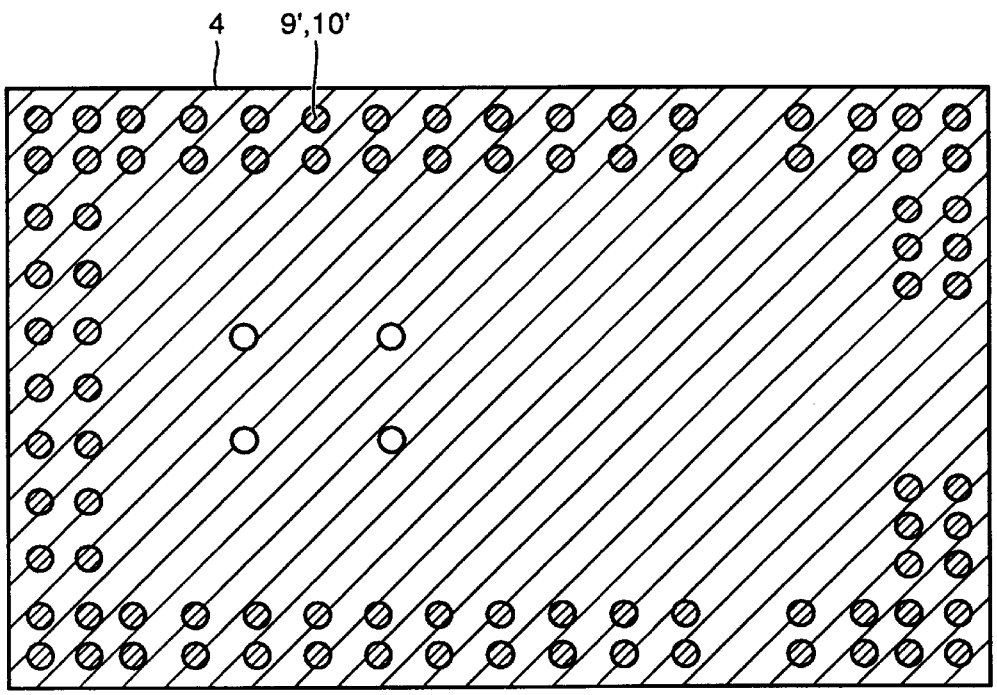

Referring to FIG. 6, the four circles that are centered on the left side of the figure represent the first slot coupling hole 3. The remaining circles all represent the positions 9', 10' of the first via hole 9 or the second via hole 10 in the second grounding conductor 4.

Figure 7:
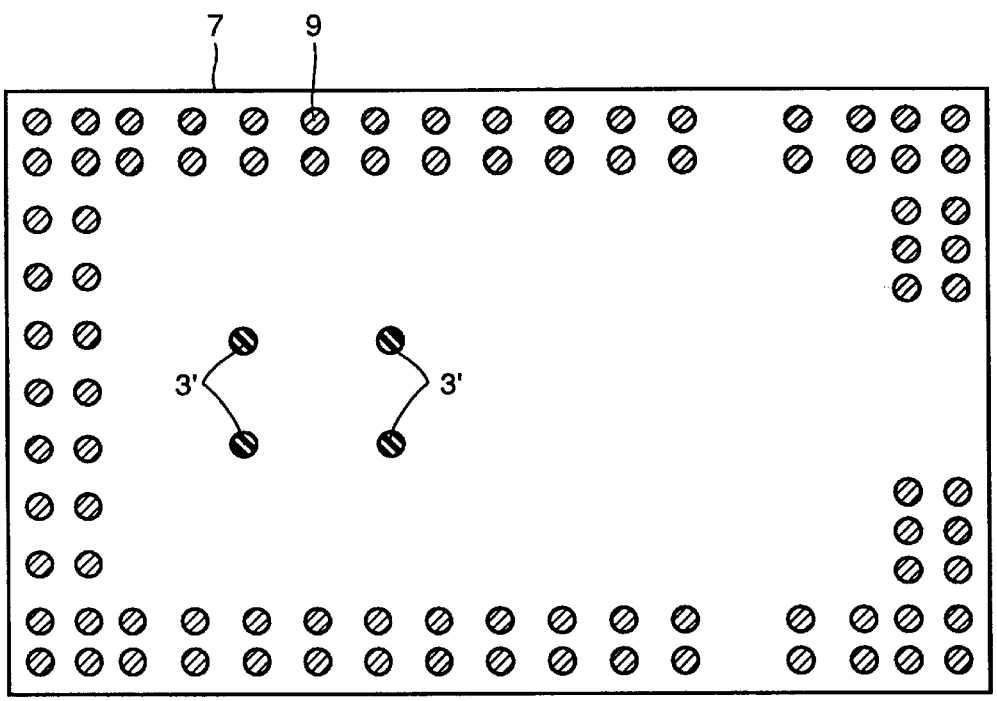
FIGS. 7 and 8, respectively show first and second dielectric substrates of the antenna-integral microwave and millimeter wave circuit according to the first embodiment of the present invention.

Referring to FIG. 7, the first slot coupling hole 3 provided in the second conductor layer is located at a position 3' when it is seen from the first dielectric substrate 7. The remaining circles all represent the positions of the first via holes 9.

Figure 8:
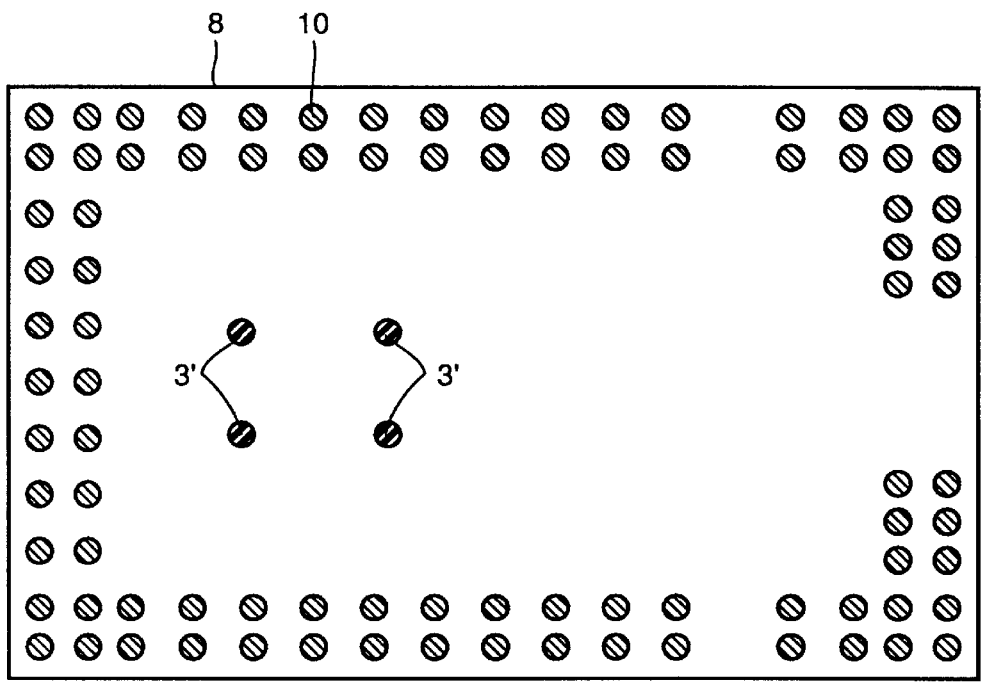

Referring to FIG. 8, the first slot coupling hole 3 provided in the second conductor layer is located at a position 3' when it is seen from the second dielectric substrate 8. The remaining circles all represent the positions of the second via holes 10'.

Figure 9:
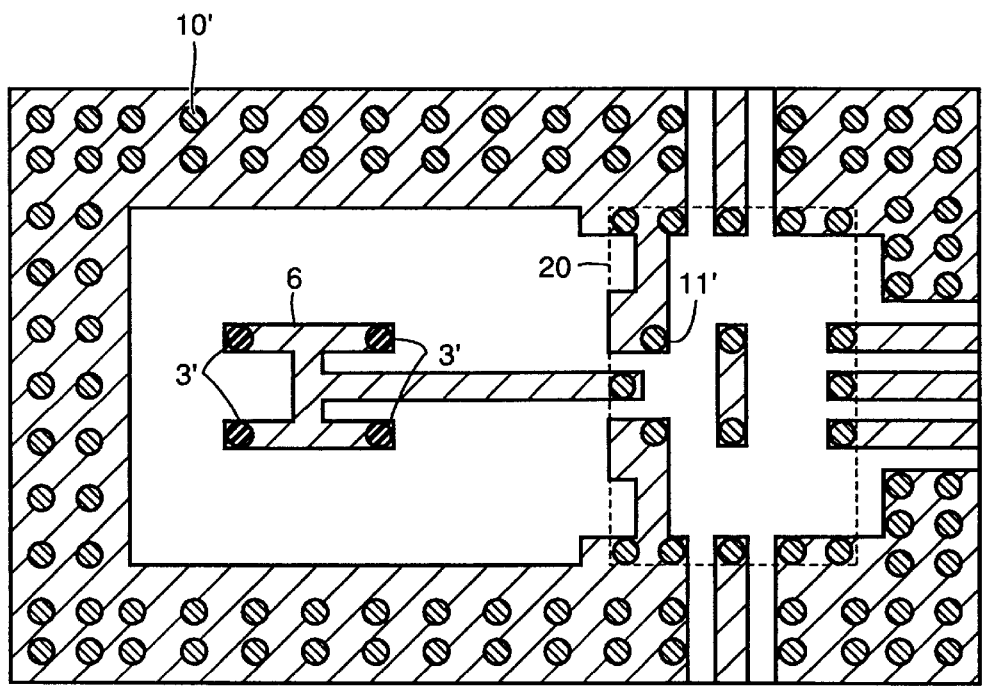
FIGS. 9 and 10, respectively show third and fourth conductor layers of the antenna-integral microwave and millimeter wave circuit according to the first embodiment.

Referring to FIG. 9, the first slot coupling hole 3 provided in the second conductor layer is located at a position 3' when it is seen from feeder circuit 6. Connecting member 11 is connected at a position 11' of a hatched circle. The remaining circles all represent the positions of the second via holes 10' in relation to the semiconductor device 20.

Figure 10:
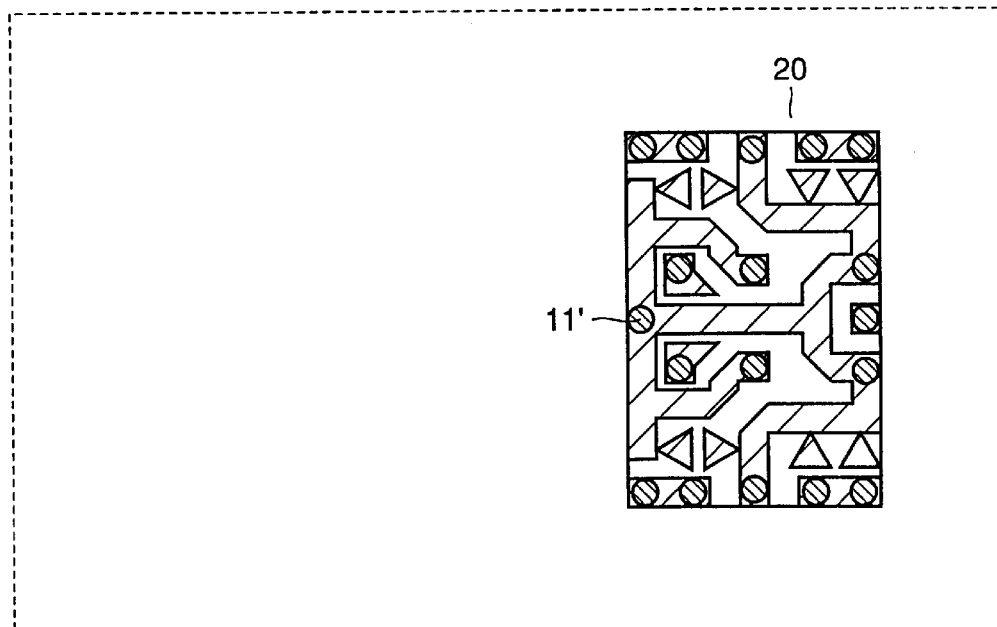

Referring to FIG. 10, connecting member 11 is connected at a position 11' of a hatched circle under the semiconductor device 20. It should be noted that while a connecting portion is described as a via hole, it may be a through hole or the like.

Second Embodiment

Figure 11:
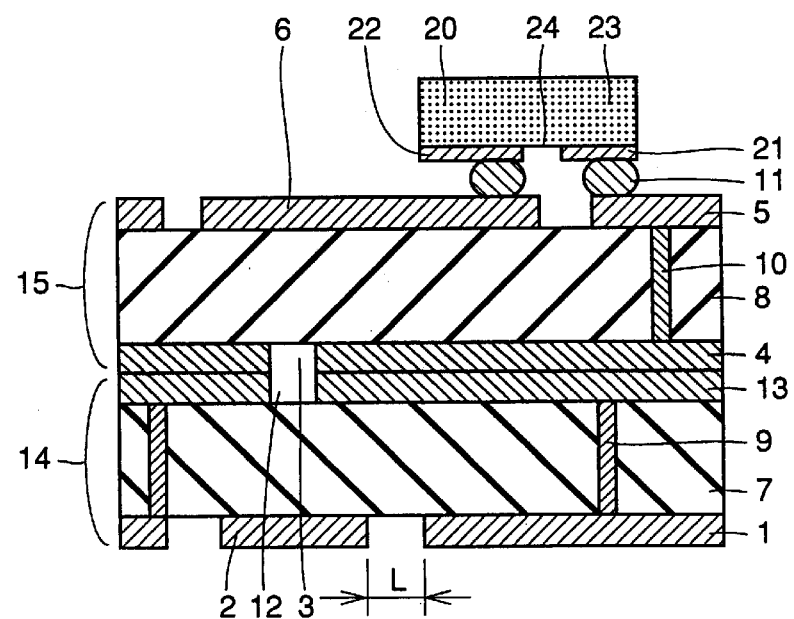
FIG. 11 shows a cross section of an antenna-integral microwave and millimeter wave circuit according to a second embodiment of the present invention.

An antenna-integral microwave and millimeter wave circuit according to a second embodiment shown in FIG. 11 differs from that according to the first embodiment shown in FIG. 2 only in that a fifth conductor layer including a second slot coupling hole 12 and a fifth grounding conductor layer 13 is formed between the second conductor layer including the second grounding conductor 4 and the first dielectric substrate 7 and in that the first via hole 9 is formed to connect the first and fifth grounding conductors 1 and 13. The identical portions in the both embodiments have the same functions and a detailed description thereof will not be repeated.

The fifth and second grounding conductors 13 and 4 are stacked to each other for electrical connection and integration such that the second slot coupling hole 12 is aligned with the first slot coupling hole 3. In the present embodiment, the first dielectric substrate 7 and the second dielectric substrate 8 are previously fired separately. Microstrip antenna 2 and the first grounding conductor 1 are printed in a form of thick film on one surface of the first dielectric substrate 7 and the second slot coupling hole 12 and the fifth grounding conductor 13 are printed in a form of thick film on the other surface of the first dielectric substrate 7 to form a first substrate portion 14. Furthermore, the third grounding conductor 5 and feeder circuit 6 are printed in a form of thick film on one surface of the second dielectric substrate 8 and the first slot coupling hole 3 and the second grounding conductor 4 are printed in a form of thick film on the other surface of the second dielectric substrate 8 to form a second substrate portion 15. Then, the first and second substrate portions 14 and 15 are pressed to be stacked on each other, and are additionally fired. Since a single layer of conductor is printed on each of the both surfaces of each of the two relatively rigid plates as the first and second dielectric substrates 7 and 8 and the both substrates are stacked on each other and additionally fired, internal stress due to layer deposition can be balanced and disadvantageous bowing and hence degradation in high frequency characteristic are minimal. Furthermore, since the substrates are stacked on each other such that the first slot coupling hole 3 is aligned with the second slot coupling hole 12, a microwave or millimeter wave signal can be efficiently coupled through the effect of electromagnetic field between feeder circuit 6 and microstrip antenna 2 via the first and second slot coupling holes 3 and 12.

Third Embodiment

Figure 12:
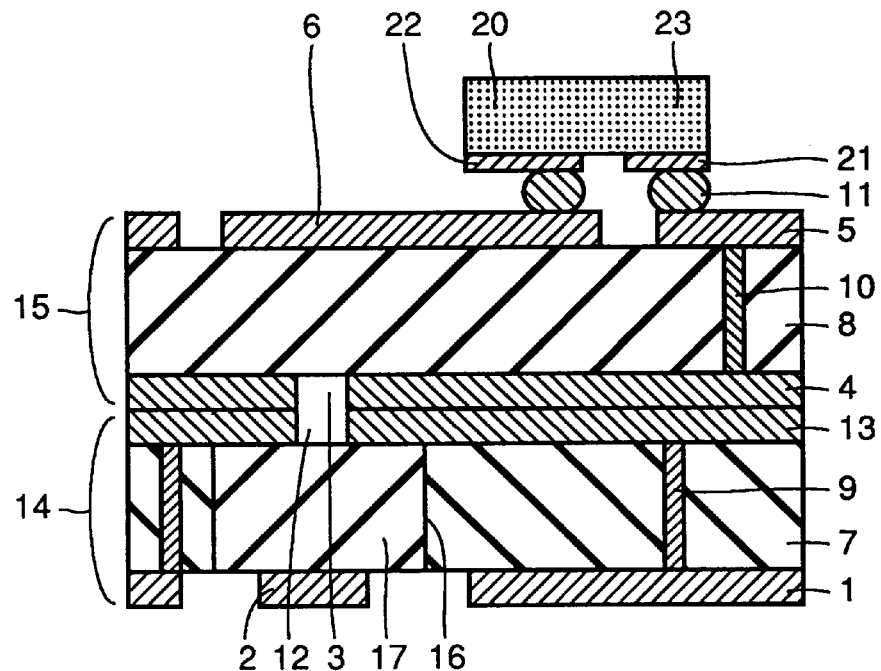
FIG. 12 shows a cross section of an antenna-integral microwave and millimeter wave circuit according to a third embodiment of the present invention.

An antenna-integral microwave and millimeter wave circuit according to a third embodiment shown in FIG. 12 differs from that according to the second embodiment shown in FIG. 11 only in that the first dielectric substrate 7 is provided with a through hole 16 to provide a third dielectric substrate 17. The same portions in the both embodiments have the same functions and a detailed description thereof will not be repeated.

Microstrip antenna 2 is formed on a surface of the third dielectric substrate 17 approximately just under the second slot coupling hole 12. The dielectric constant of the third dielectric substrate 17 is extremely smaller than those of the first and second dielectric substrates 7 and 8 to further improve the radiation characteristics, such as directivity and efficiency, of the microstrip antenna 2. While the third dielectric substrate 17 may be provided by burying and additionally firing it, it may be pro-sided by fitting a third dielectric substrate 17 of Teflon, quartz or the like with a low dielectric constant with microstrip antenna 2 formed thereon.

Fourth Embodiment

Figure 13:
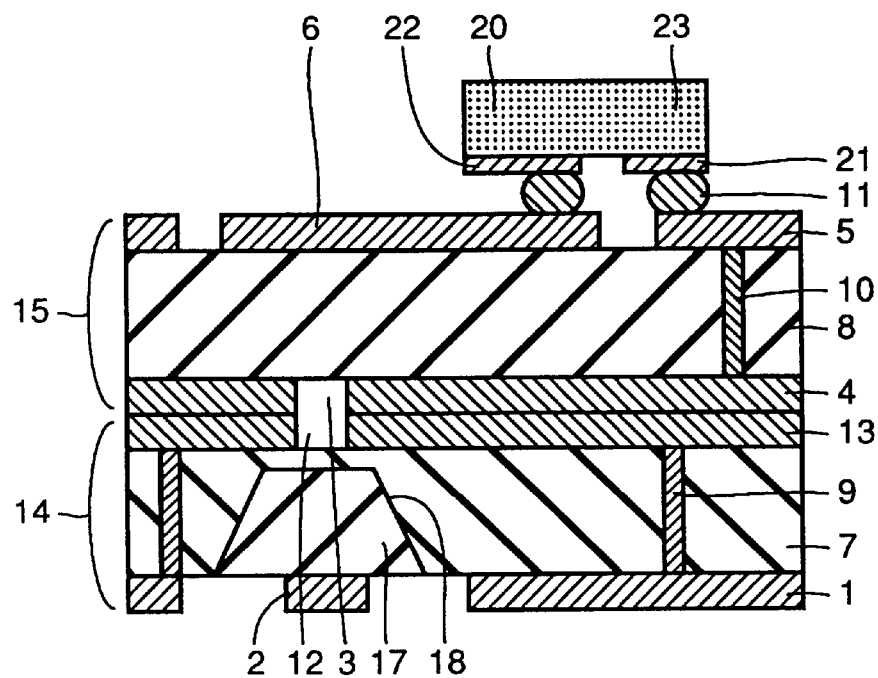
FIG. 13 shows a cross section of an antenna-integral microwave and millimeter wave circuit according to a fourth embodiment of the present invention.

An antenna-integral microwave and millimeter wave circuit according to a fourth embodiment shown in FIG. 13 differs from that according to the second embodiment shown in FIG. 11 only in that the first dielectric substrate 7 is provided with a recessed portion 18 to provide the third dielectric substrate 17. The identical portions in the both embodiments have the identical functions and a detailed description thereof will thus not be repeated.

A side surface of recessed portion 18 is inclined and thus the third dielectric substrate 17 can readily be buried or fitted. While the third dielectric substrate 17 is shown being level with a surface of the first dielectric substrate 7, it can be recessed with respect to the surface of the dielectric substrate 7 to adjust the spacing between the second slot coupling hole 12 and microstrip antenna 2 and thus control the frequency band width of microstrip antenna 2.

It should be noted that an antenna-integral microwave and millimeter wave circuit typically requires a cover, such as radome, for protection of the antenna portion, such as prevention of degradation and change in the characteristics thereof due to pollution, in fabricating the circuit as a communication apparatus together with an intermediate frequency (IF) circuit, a power supply portion, a display portion, a cage body and the like. When the cover comes into directly contact with a surface of microstrip antenna 2, the radiation characteristic thereof is changed and thus the cover is provided such that it does not come into contact with microstrip antenna 2. When dielectric substrate 17 is recessed in the present embodiment, microstrip antenna 2 will be recessed relative to the first grounding conductor 1. Accordingly, if a cover is provided in contact with the first grounding conductor 1, a sufficient spacing can be maintained between microstrip antenna and the cover. As such, while the radiation characteristic of the antenna is maintained, the thickness of the entirety of the antenna-integral microwave and millimeter wave circuit is not changed. Thus, the strength of the circuit against stress can be maintained to contemplate a thin circuit. Furthermore, a thin circuit can result in the increased Q value and narrowed bandwidth of the antenna to reduce radiation of unnecessary wave.

Fifth Embodiment

Figure 14:
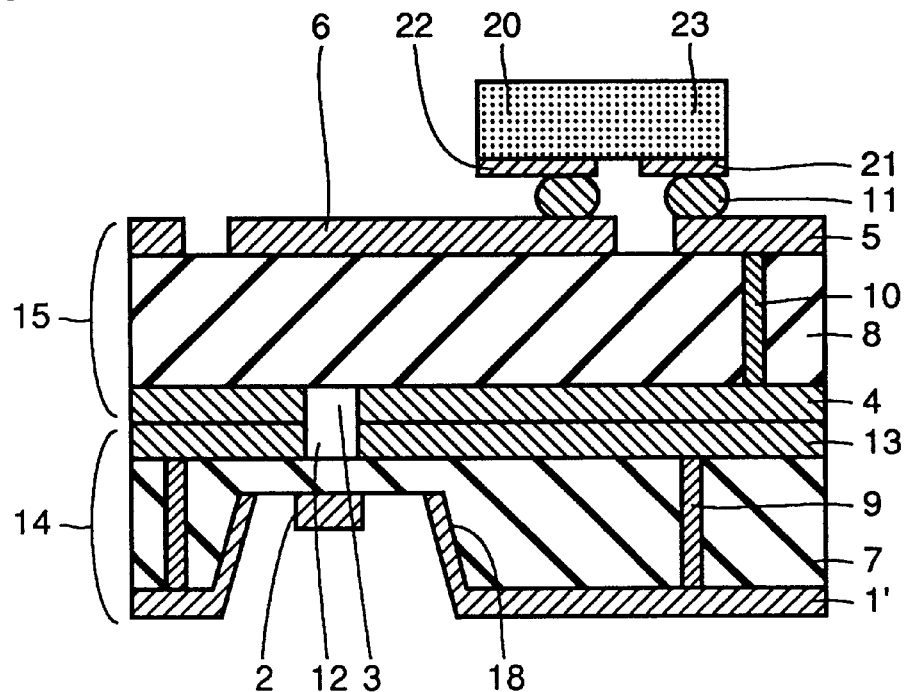
FIG. 14 shows a cross section of an antenna-integral microwave and millimeter wave circuit according to a fifth embodiment of the present invention.

An antenna-integral microwave and millimeter wave circuit according to a fifth embodiment shown in FIG. 14 differs from that according to the second embodiment shown in FIG. 11 only in that the first dielectric substrate 7 is provided with recessed portion 18 and the first grounding conductor 1' is formed to cover a side surface of recessed portion 18 and in that microstrip antenna 2 is provided on a bottom surface of recessed portion 18. The identical portions in the both embodiments have the identical functions and a detailed description thereof will not be repeated.

The formation of the first grounding conductor 1' covering a side surface of recessed portion 18 can prevent unnecessary radiation (i.e. leakage of electromagnetic field) from a side surface of the first dielectric substrate 7. While the originally reduced thickness of the first dielectric substrate 7 in the present embodiment allows microstrip antenna 2 provided on the bottom surface of recessed portion 18 and the first grounding conductor provided on the side surface of recessed portion to be printed in a form of thick film, they may be formed in a form of thin film.

Sixth Embodiment

Figure 15:
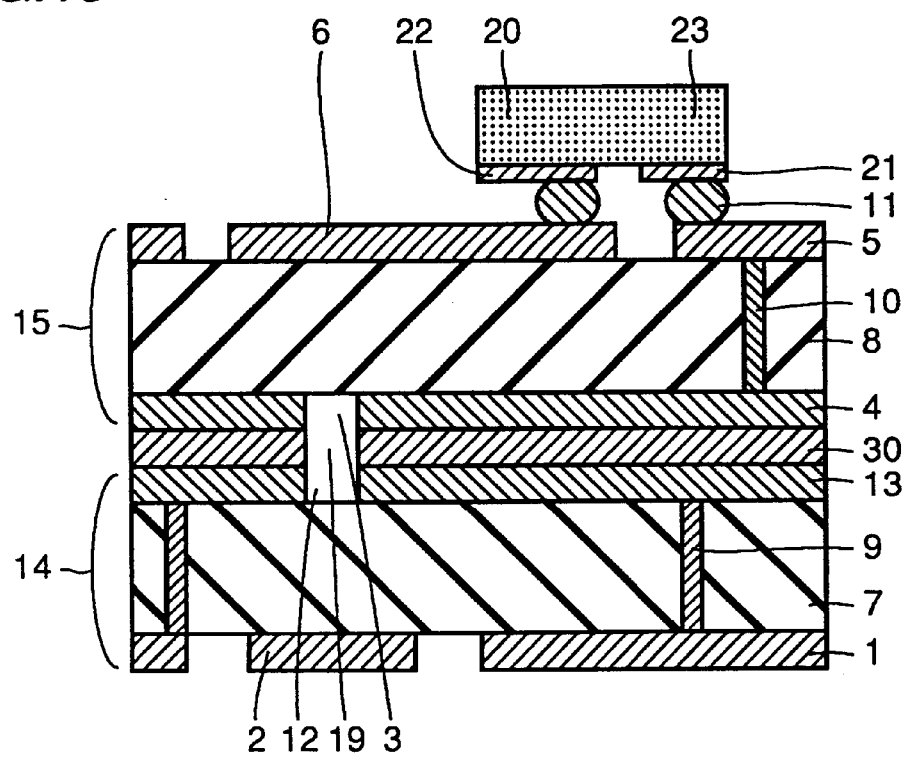
FIG. 15 shows a cross section of an antenna-integral microwave and millimeter wave circuit according to a sixth embodiment of the present invention.

An antenna-integral microwave and millimeter wave circuit according to a sixth embodiment shown in FIG. 15 differs from that according to the second embodiment shown in FIG. 11 only in that a sixth conductor layer including a third slot coupling hole 19 and a sixth grounding conductor 30 is provided between the second conductor layer including the first slot coupling hole 3 and the second grounding conductor 4 and the fifth conductor layer including the second slot coupling hole 12 and the fifth grounding conductor 13. The identical portions in the both embodiments have the identical functions and a detailed description thereof will not be repeated.

The sixth grounding conductor 30 is desposed between and thus electrically connected to the second and fifth grounding conductors 4 and 13 such that the third slot coupling hole 19 is aligned with the first slot coupling hole 3 and the second slot coupling hole 12. Although the sixth conductor layer may be printed in a form of thick film on the first substrate portion 14 and then fired simultaneously with it, the sixth conductor layer provided with the third slot coupling hole 19 may be connected between separately fired first and second substrate portions 14 and 15 by means of e.g. soldering or conductive sheet or thin metal film. The antenna-integral microwave and millimeter wave circuit may also be structured through simultaneous firing such that a base member provided with a large number of via holes as the sixth conductor layer provided with the third slot coupling hole 19 is interposed between the substrate portions. Such a structure can enhance the strength of the circuit, simplify the manufacturing process, as compared with the connection by means of a conductor layer, and allow reliable, precise and stable fabrication of the circuit. A layer or base member between the second and fifth grounding conductors 4 and 13 need not be entirely formed of conductor and a large number of conductors present in the layer may maintain both sides of the layer or base member at a same potential. Dielectric loss, variation of resonance frequency, and degradation of coupling efficiency associated therewith can be prevented, as compared with the cases in which non-conductive adhesive or pressure sensitive adhesive sheet is used to simply stick the layer.

Seventh Embodiment

Figure 16:
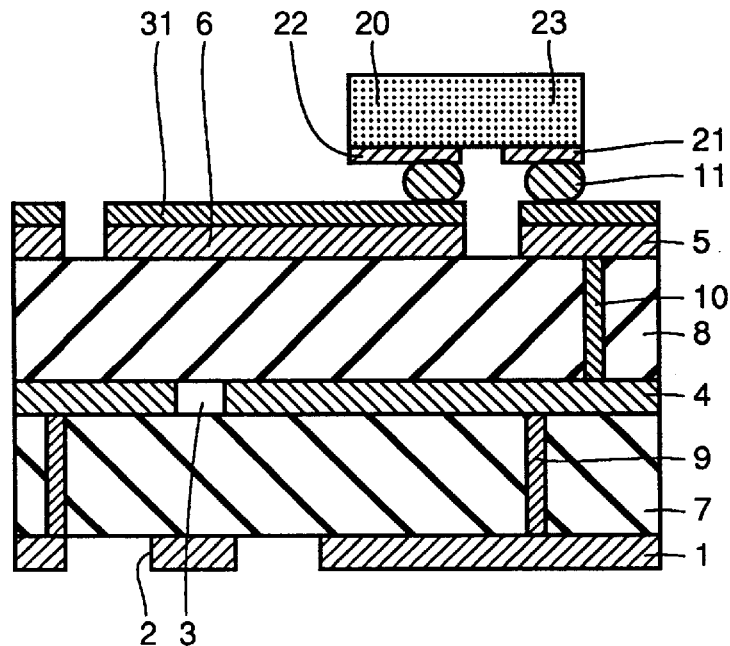
FIG. 16 shows a cross section of an antenna-integral microwave and millimeter wave circuit according to a seventh embodiment of the present invention.

An antenna-integral microwave and millimeter wave circuit according to a seventh embodiment shown in FIG. 16 differs from that according to the first embodiment shown in FIG. 2 only in that semiconductor device 20 is mounted after a plating conductor 31 is formed by electrolytic plating with Au on the third conductor layer including the third grounding conductor 5 and feeder circuit 6. The identical portions in the both embodiments have the identical functions and thus a detailed description thereof will not be repeated.

Forming a conductor layer as a portion of a sintered body limits the materials used for the conductor layer and sometimes cannot avoid using a material with high resistance. Particularly for millimeter wave, the tendency of skin effect is significant and accordingly the third conductor layer is plated with a conductor of low resistance to obtain an effect similar to that obtained by applying a conductor of low resistance as the third conductor layer.

Eighth Embodiment

Figure 17:
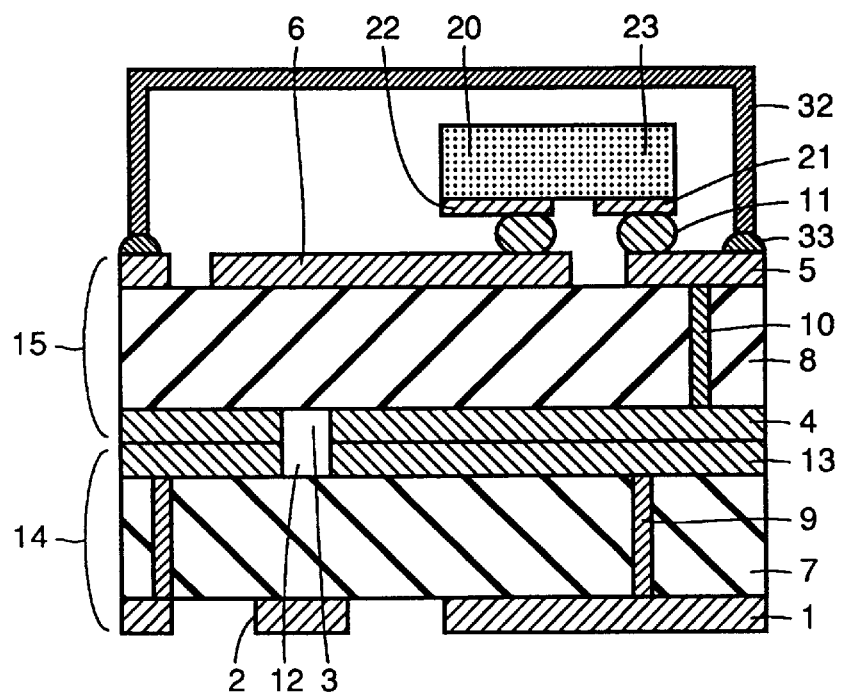
FIG. 17 shows a cross section of an antenna-integral microwave and millimeter wave circuit according to an eighth embodiment of the present invention.

An antenna-integral microwave and millimeter wave circuit according to an eighth embodiment shown in FIG. 17 differs from that according to the second embodiment shown in FIG. 11 only in that a cap 32 surrounding semiconductor device 20 and feeder circuit 6 is connected to the third grounding conductor 5 by means of adhesive 33. The identical portions in the both embodiments have the same functions and a detailed description thereof will not be repeated.

Cap 32 is formed of ceramic with a conductive layer formed on internal and external surfaces thereof, and is desposed to the third grounding conductor 5 by means of adhesive 33, such as conductive paste. Unnecessary radiation from semiconductor device 20 and feeder circuit 6 and unnecessary incidence from the external can be prevented in the present embodiment.

Ninth Embodiment

Figure 18:
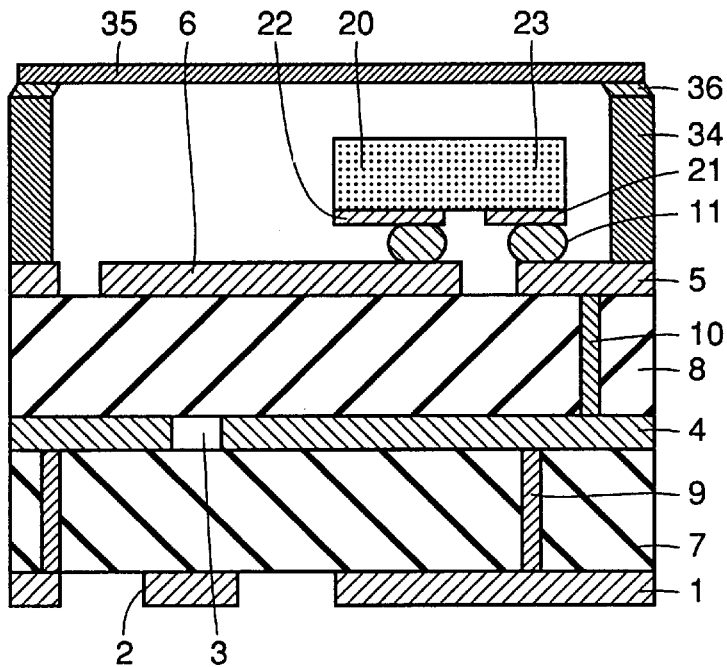
FIG. 18 shows a cross section of an antenna-integral microwave and millimeter wave circuit according to a ninth embodiment of the present invention.

An antenna-integral microwave and millimeter wave circuit according to a ninth embodiment shown in FIG. 18 differs from that according to the first embodiment shown in FIG. 2 only in that a frame 34 surrounds semiconductor device 20 and feeder circuit 6 and a lid 35 is joined on an upper surface of frame 34 by means of a sealing material 36. The identical portions in the both embodiments have the same functions and a detailed description thereof will not be repeated.

Frame 34 is printed in a form of thick film at a perimeter of the third conductor layer and is fired simultaneously with the third conductor layer. Lid 35 is formed of an alloy steel consisting of cobalt, nickel and the like and can prevent unnecessary radiation from feeder circuit 6 and unnecessary incidence from the external. Adhesion between lid 35 and frame 34 is provided by means of sealing member 36, such as AuSn.

Tenth Embodiment

Figure 19:
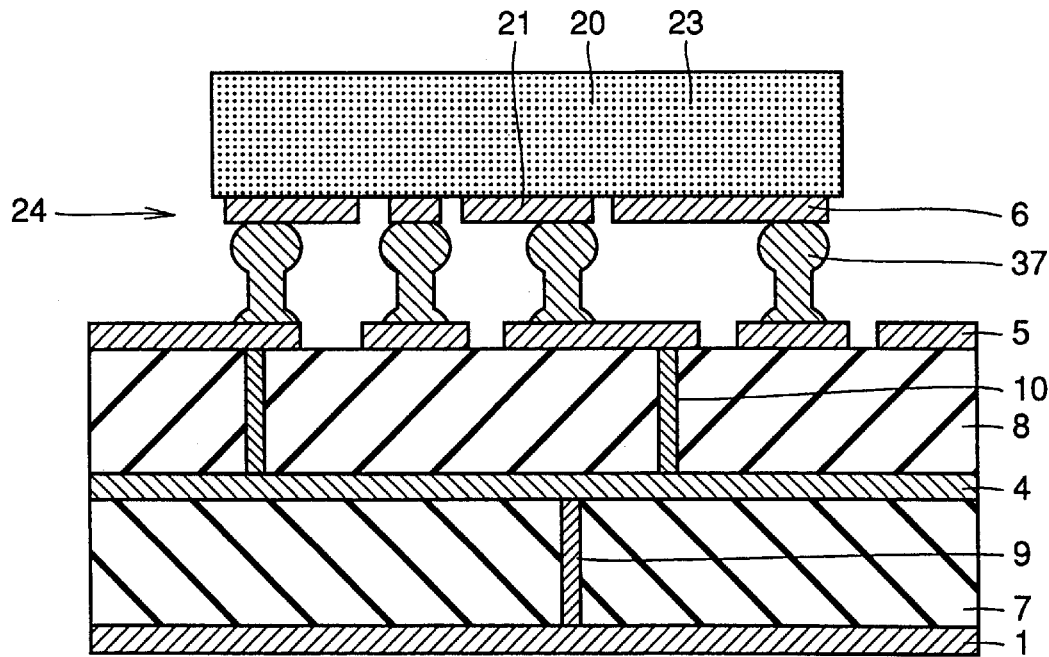
FIG. 19 shows a cross section of an antenna-integral microwave and millimeter wave circuit according to a tenth embodiment of the present invention.

An antenna-integral microwave and millimeter wave circuit according to a tenth embodiment shown in FIG. 19 differs from that according to the first embodiment shown in FIG. 2 only in that a protruding electrode 37 the height of which is greater than the diameter of a cross section thereof is employed as connecting member 11 for connecting semiconductor device 20 and the third conductor layer. The identical portions of the both embodiments have the same functions and a detailed description thereof will not be repeated.

A bead obtained by coating a resin ball with a conductive film, an anisotropic conductive sheet or the like is used as protruding electrode 37. While the present embodiment employs Au as the material for protruding electrode 37, it may also employ SnPb soldering, other metals or alloys. The height of protruding electrode 37 after its connection, i.e. the spacing between microwave and millimeter wave circuit 24 and feeder circuit 6 or the third grounding conductor 5 is determined, considering the dielectric characteristic of a substance interposed therebetween, the frequency of microwave and millimeter wave circuit 24 and the like. More specifically, it is desirable that the spacing is greater than 10 $\mu$m and less than 200 $\mu$m. In order to significantly reduce the height of protruding electrode 37, the dielectric constant of an interposed substance need be reduced significantly. The variation of the spacing due to a slight bowing of a substrate and a slight inclination of semiconductor device 20 relative to the third conductor layer is increased relative to the spacing as the spacing is reduced. As such, margin is reduced and an antenna-integral microwave and millimeter wave circuit with stable high frequency characteristic can not be manufactured at low cost. Furthermore, parasitic capacitance will be added to an active or passive element formed in microwave and millimeter wave circuit 24. When the spacing exceeds 200 $\mu$m, the effect of impedance variation due to the parasitic inductance component of protruding electrode 37 will not be negligible and such influences of high frequency characteristics are seen that the required frequency band width can not be ensured. While the interposed substance is air in the present embodiment, it may be other gas, liquid or solid, depending on the dielectric characteristic. The connection of protruding electrode 37 at both of the connecting portions with semiconductor device 20 and the third conductor layer is provided by thermocompression bonding of Au to Au.

Figure 20A:
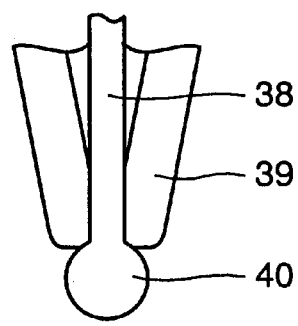
FIG. 20A shows a step of forming a fine ball 40 at a tip of a capillary 39.

FIGS. 20A, 20B, 20C, 20D illustrate a process for fabricating protruding electrode 37 of the antenna-integral microwave and millimeter wave circuit according to the tenth embodiment shown in FIG. 19. First, a fine ball 40 is formed through e.g. spark at a tip of a thin wire 38 of a metal or alloy coming out of a capillary 39, as shown in FIG. 20A. An Au wire to which a type of element is added and which has a wire diameter of 20 $\mu$m is used as wire 38 to form a fine ball of approximately 45 $\mu$m in diameter.

Figure 20B:
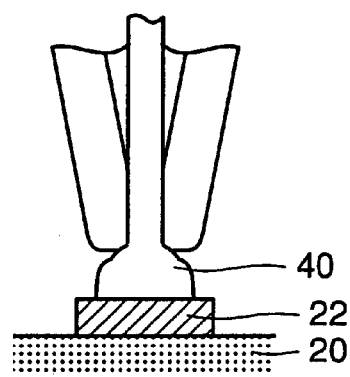
FIG. 20B shows a step of connecting a fine ball 40 to a site at which a protruding electrode of a semiconductor device 20 is to be formed.

Then, as shown in FIG. 20B, fine ball 40 is connected (by ball bonding) by applying heat, pressure and ultrasonic wave, to a site at which a protruding electrode of semiconductor device 20 is to be formed, such as an appropriate portion on input/output terminal portion 22 of microwave and millimeter wave circuit 20.

Figure 20C:
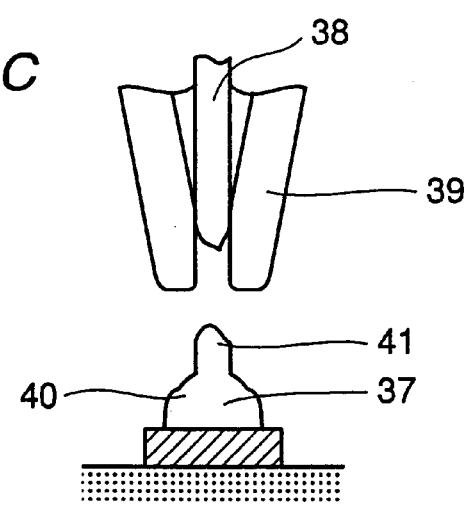
FIG. 20C shows a step of forming a protruding electrode 37 having a relatively short tail 41.

Then, as shown in FIG. 20C, when fine ball 40 of wire 38 is completely connected, thin wire 38 is clamped by the bonder mechanism and is thus cut at the boundary of the crystallized region when capillary 39 is elevated, so that a protruding electrode 37 is formed having a relatively short tail 41. Thus, protruding electrode 37 is formed having a diameter of approximately 50 $\mu$m, a tail 41 length of approximately 60 $\mu$m and an overall height of approximately 100 $\mu$m.

Figure 20D:
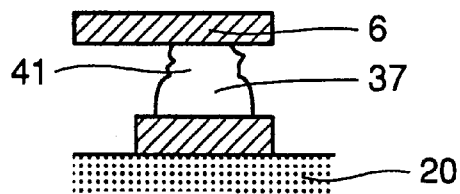
FIG. 20D shows a step of connecting semiconductor device 20 to a feeding circuit 6 via protruding electrode 37.

Then, as shown in FIG. 20D, semiconductor device 20 and the third conductor layer are aligned and protruding electrode 37 is connected (by flip-chip bonding) to that site of the third conductor layer which protruding electrode 37 is to be connected to, e.g. feeding circuit 6, while heat and pressure is applied to protruding electrode 37. Tail 41 is mainly crushed and the height of protruding electrode 37 after its connection is approximately 70 $\mu$m.

The diameter and material of wire 38, the shape of capillary 39, spark condition, ball bonding condition and flip-chip bonding condition can be changed to obtain a desired height of protruding electrode 37 depending on dielectric characteristic and the like. It should be noted, however, that when the ball bonding is provided so that a relatively long tail 41 is provided with respect to the diameter of thin wire 38, tail 41 can be buckled in the flip-chip bonding. In order to obtain a protruding electrode 37 having a height of some extent relative to the diameter of wire 38 in one ball bonding, it is desirable that spark condition and the material for wire 38 are selected so that the diameter of fine ball 40 initially formed from wire 38 with a thickness of some extent is not so larger relative to the diameter of wire 38.

It is particularly suitable that Au is employed as the material of protruding electrode 37 and is connected by thermocompression bonding due to its high frequency characteristic and reliability. A photolithography step in wafer process is well known as another method of fabricating protruding electrode 37 of Au. It includes complicated steps of: forming a metal for feeding power; then applying resist higher than the height of the protruding electrode; removing the resist at a location for forming the protruding electrode by means of exposure and development to expose the metal for feeding power; growing the protruding electrode on the metal for feeding power by electrolytic plating; and then removing the resist and the metal for feeding power. However, there is a limit to the photosensitivity, flatness of resist, alignment mark reading and the like, and the height only reaches approximately 20 $\mu$m before flip-chip bonding and will be approximately 10 to 15 $\mu$m after flip-chip bonding. In particular, a protruding electrode cannot be obtained with such a height after flip-chip bonding as required for millimeter wave, i.e. more than 30 $\mu$m.

Although the photolithography step can be repeated again to increase the height, the wafer process becomes further complicated, which results in increasing the cost enormously. Furthermore, arrangement of a protruding electrode is subject to a number of constraints resulting from the process, and changing the arrangement requires designing the mask again, which results in a prolonged period of the development.

By contrast, the present invention readily allows protruding electrode 37 to be as high as approximately 200 $\mu$m after flip-chip bonding, as described above. Furthermore, an additional ball bonding may be provided on the ball-bonded protruding electrode 37 shown in FIG. 20C, or a protruding electrode 37 may be provided through ball bonding on each of semiconductor device 20 and the third conductor layer and the protruding electrodes 37 are opposed to each other and connected by means of flip-chip bonding. Although the number of ball bonding is increased, the height of protruding electrode 37 can be drastically raised relative to the diameter of protruding electrode 37 to reduce the area for provision of protruding electrode 37 and thus improve the degree of freedom of design. Furthermore, the step of fabricating protruding electrode 37 is provided after a wafer is completed or it is diced into chips, and thus the arrangement can readily be changed.

Figure 21:
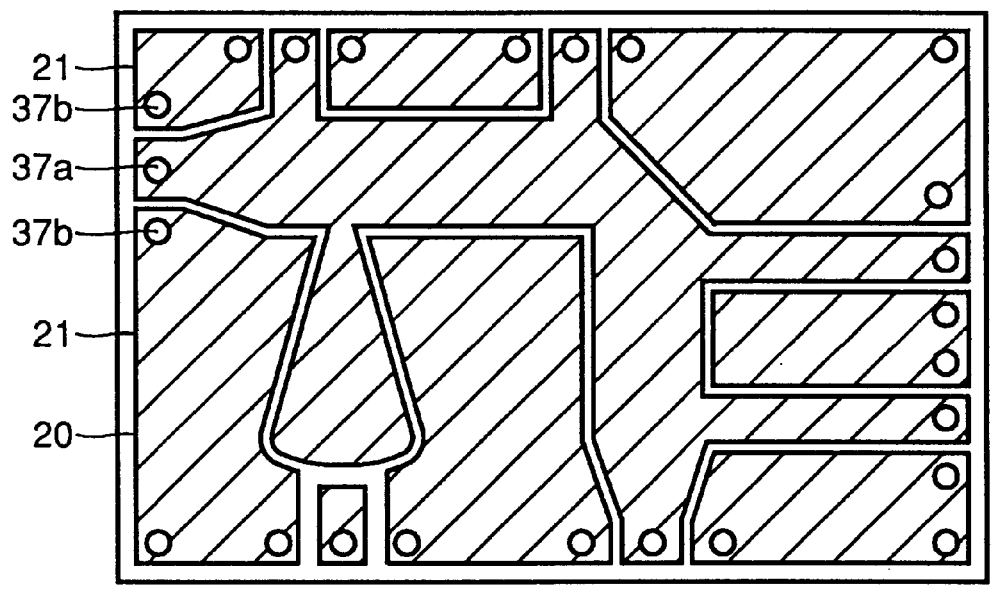
FIG. 21 is a plan view of a semiconductor device 20 of the antenna-integral microwave and millimeter wave circuit according to the tenth embodiment.

Referring to FIG. 21, a coplanar line is mainly employed as microwave and millimeter wave circuit 24 of semiconductor device 20. A fourth grounding conductor 21, with protruding electrodes 37a and 37b, located at both sides of a central conductor of the coplanar line is inevitably divided in two dimensions according to the circuit design. Conventionally, an air bridge is employed or a via hole and a lower interconnection are formed in semiconductor substrate 23 so that the divided fourth grounding conductors 21 have a same potential. However, as the circuit is increasingly complicated and the scale thereof is increased, stable ground cannot be ensured, and parasitic capacitance is increased or parasitic oscillation is generated disadvantageously. By contrast, the present embodiment provides not only a typical air bridge connection (not shown) between conductors but each of the divided fourth grounding conductors 21 are connected to the third grounding conductor 5 via a respective protruding electrode. Accordingly, the grounds can attain a same potential, the circuit can operate stably, and generation of parasitic capacitance can be restricted. Since the number of air bridges for connection can also be reduced, the parasitic capacitance at the air bridging portions can be reduced and high frequency characteristic and hence manufacturing yield can be improved. While semiconductor substrate 23 is employed as a substrate for formation of microwave and millimeter wave circuit 24, it may be a dielectric substrate of ceramic or the like.

Eleventh Embodiment

Figure 22:
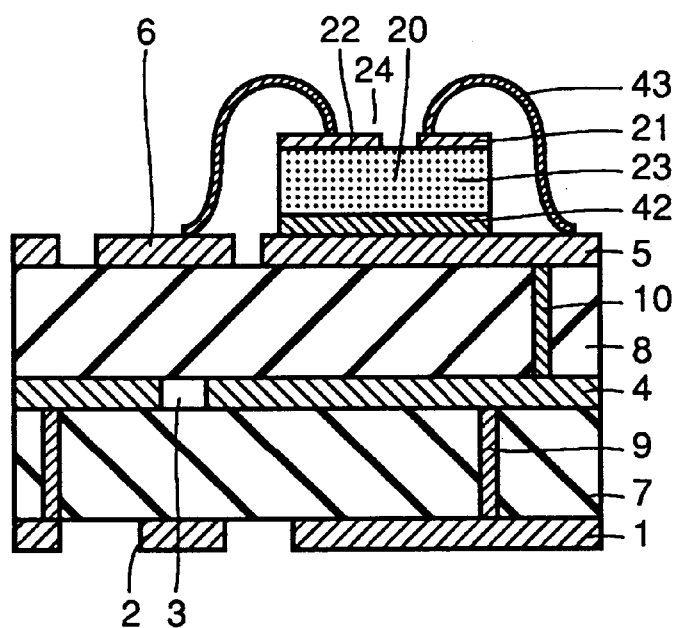
FIGS. 22 and 23 are cross sections of antenna-integral microwave and millimeter wave circuits according to eleventh and twelfth embodiments of the present invention, respectively.

An antenna-integral microwave and millimeter wave circuit according to an eleventh embodiment shown in FIG. 22 differs from that shown in FIG. 2 in that semiconductor device 20 is mounted faceup, that a seventh grounding conductor 42 is formed on a back surface of semiconductor device 20 and is connected to the third grounding conductor 5, and in that the connection between input/output terminal portion 22 of semiconductor device 20 and feeder circuit 6 or the connection between the fourth grounding conductor 21 of semiconductor device 20 and the third grounding conductor 5 is provided by means of a thin ribbon 43. The identical portions in the both embodiments have the same functions and a detailed description thereof will not be repeated.

Microwave and millimeter wave circuit 24 of semiconductor device 20 is formed of microstrip line. While ribbon 43 is an Au ribbon of 80 $\mu$m in width and 20 $\mu$m in thickness, it may be a ribbon or wire the cross section of which is different depending on the high frequency characteristic. The seventh grounding conductor 42 on the back surface of semiconductor device 23 provides a ground in microwave and millimeter wave circuit 24 formed of microstrip line. The seventh grounding conductor 42 can be connected directly to the third grounding conductor 5, and the first, second, third and seventh grounding conductors 1, 4, 5 and 42 are electrically connected in the shortest distance. Accordingly, microwave and millimeter wave circuit 24 is not affected by parasitic capacitance and the like therein and in microstrip antenna 2. Furthermore, microwave and millimeter wave circuit 24 can achieve stable operation with reduced noise. Microstrip antenna 2 can also obtain good radiation pattern characteristic with reduced side lobe.

Twelfth Embodiment

Figure 23:
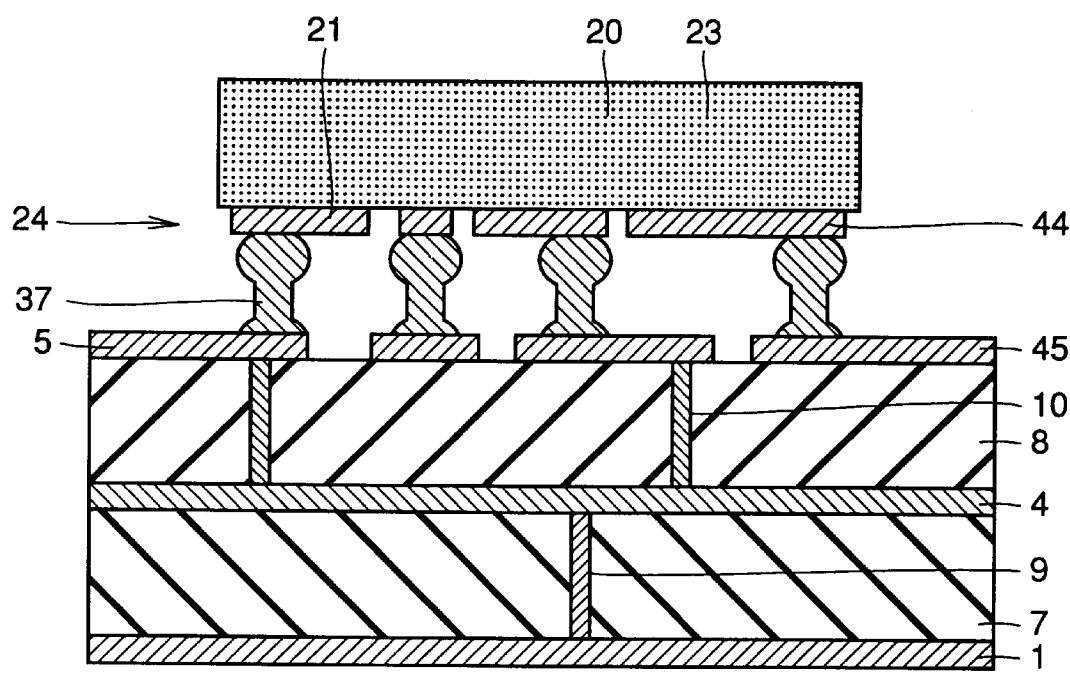

An antenna-integral microwave and millimeter wave circuit according to a twelfth embodiment shown in FIG. 23 differs from that according to the first embodiment shown in FIG. 2 in that microwave and millimeter wave circuit 24 of semiconductor device 20 has the function of frequency converter and includes an intermediate frequency input/output terminal portion 44 receiving a signal at a converted, intermediate frequency and that the third conductor layer is provided with an intermediate frequency input/output terminal portion 45 connected to intermediate frequency input/output terminal portion 44 via protruding electrode 37 for transmitting a signal at an intermediate frequency. The identical portions in the both embodiments have the same functions and a detailed description thereof will not be repeated.

Intermediate frequency input/output terminal portion 45 is connected via a connecting potion (not shown), such as a connector, to an external circuit substrate (not shown) for processing intermediate frequency signals. A connecting portion which transmits a signal at high frequency, such as microwave and millimeter wave, requires a special technique suitable for high frequency, such as use of coaxial line, to avoid the leakage, reflection, absorption and the like of signals. Signals at high frequency, such as microwave and millimeter wave, are processed in semiconductor device 20 at microwave and millimeter wave circuit 24 and the portion with frequency converter function and thus will no longer be at high frequency at intermediate frequency input/output terminal portion 44. As such, a special technique is not required for the connecting portion for connecting intermediate frequency input/output terminal portion 45 and the external circuit substrate (not shown) for processing intermediate frequency. The frequency converting portion may be an up converter or a down converter and is configured depending on the purpose of processing originally input signals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An antenna-integral high frequency circuit comprising:
   a first conductor layer provided with a microstrip antenna;
   a second conductor layer including a first grounding portion provided with a first slot-coupling hole;
   a third conductor layer including a feeder circuit electromagnetically coupled with said microstrip antenna via said first slot coupling hole, and a second grounding portion physically separated from the feeder circuit;

a semiconductor device including a fourth conductor layer having an input/output terminal portion connected to said feeder circuit and a third grounding portion connected to said second grounding portion so that the third grounding portion is physically separated from the terminal portion, and a high frequency circuit having said fourth conductor layer on a surface thereof;

a first dielectric substrate deposited between said first and second conductor layers;

a second dielectric substrate deposited between said second and third conductor layers; and a first connecting portion provided to connect said first grounding portion and said second grounding portion such that a distance from said first grounding portion to said third grounding portion is less than one fourth of a wavelength associated with said high frequency circuit.

2. The antenna-integral high frequency circuit according to claim 1, wherein the first and second dielectric substrates each have a thickness of at least about 150 µm.

3. The antenna-integral high frequency circuit according to claim 1, further comprising:

said first conductor layer also including a fourth grounding portion surrounding said microstrip antenna; and a second connecting portion provided to connect said first grounding portion and said fourth grounding portion, wherein the fourth grounding portion is physically separated from the microstrip antenna.

4. The antenna-integral high frequency circuit according to claim 1, further comprising:

said first conductor layer also including a fourth grounding portion surrounding said microstrip antenna, wherein the fourth grounding portion is physically separated from the microstrip antenna;

a fifth conductor layer provided between said first dielectric substrate and said second conductor layer and having a fifth grounding portion provided with a second slot coupling hole aligned with the first slot coupling hole; and a third connecting portion provided to connect said fourth grounding portion and said fifth grounding portion.

5. The antenna-integral high frequency circuit according to claim 1, further comprising:

said first dielectric substrate having a through hole provided between said microstrip antenna and said first slot coupling hole; and a third dielectric substrate provided in said through hole and having a dielectric constant smaller than a dielectric constant of said first dielectric substrate.

6. The antenna-integral high frequency circuit according to claim 1, wherein said first dielectric substrate has a recessed portion between said microstrip antenna and said first slot coupling hole such that the recessed portion places said first slot coupling hole closer to said microstrip antenna, further comprising a third dielectric substrate provided in said recessed portion and having a dielectric constant smaller than a dielectric constant of said first dielectric substrate.

7. The antenna-integral high frequency circuit according to claim 3, wherein:

said first dielectric substrate has a recessed portion between said microstrip antenna and said first slot coupling hole such that the recessed portion places said first slot coupling hole closer to said microstrip antenna;

said microstrip antenna is provided on a bottom surface of said recessed portion; and said fourth grounding portion is provided at a region including a side surface of said recessed portion and surrounds said microstrip antenna.

8. The antenna-integral high frequency circuit according to claim 1, wherein a dielectric constant of said first dielectric substrate is lower than a dielectric constant of said second dielectric substrate.

9. The antenna-integral high frequency circuit according to claim 1, as a single multilayer body with at least said first dielectric substrate, said second dielectric substrate and said first grounding portion simultaneously fired.

10. The antenna-integral high frequency circuit according to claim 1, further comprising a plating conductor disposed on at least one of said third and fourth conductor layers, wherein said third and fourth conductor layers are connected via said plating conductor.

11. The antenna-integral high frequency circuit according to claim 1, further comprising a cap covering at least said semiconductor device and connected to said second grounding portion.

12. The antenna-integral high frequency circuit according to claim 1, wherein at least one of said first and second dielectric substrates is fired simultaneously with an adjacent conductor layer.

13. The antenna-integral high frequency circuit according to claim 1, wherein said high frequency circuit includes a frequency converting portion that converts a high frequency signal into an intermediate frequency signal.

14. The antenna-integral high frequency circuit according to claim 1, wherein the second dielectric substrate has a thickness of about 250 µm.

15. The antenna-integral high frequency circuit according to claim 1, wherein the substrates are deposited without the use of an adhesive.

16. The antenna-integral high frequency circuit according to claim 1, wherein the first dielectric substrate has a thickness of about 150 µm.

* * * * *